United States Patent [19]

Wong

[11] Patent Number: 4,577,296

[45] Date of Patent: Mar. 18, 1986

[54] COMPENSATION CURRENT GENERATOR

[75] Inventor: Thomas S. W. Wong, San Jose, Calif.

[73] Assignee: Advanced Micro Devices, Inc., Sunnyvale, Calif.

[21] Appl. No.: 585,332

[22] Filed: Mar. 1, 1984

[51] Int. Cl.[4] .......................... G11C 7/04; G05F 1/58
[52] U.S. Cl. .................................. 365/226; 365/211; 307/297; 307/491
[58] Field of Search ............... 307/297, 491; 365/206, 365/207, 208, 211, 212, 226, 155, 179; 323/17

[56] References Cited

U.S. PATENT DOCUMENTS 3,721,893  3/1973  Davis .................................. 307/297
3,781,648  12/1973  Owens .............................. 307/297

Primary Examiner—Joseph A. Popek
Attorney, Agent, or Firm—J. Vincent Tortolano; Patrick T. King

[57] ABSTRACT

A compensation current generator circuit for generating a compensation current which is inversely proportional to the current gain of a bipolar transistor is presented. The current generated by the compensation current generator circuit of the present invention compensates for current gain fluctuations caused by temperature and/or process variations which can adversely affect the operation of an integrated circuit device.

8 Claims, 3 Drawing Figures

Vcc ─────────────────

────────────── HIGH BASE OF THE MEMORY CELL

── ── ── ── ── SENSE LEVEL

────────────── LOW BASE OF THE MEMORY CELL

COMPENSATION CURRENT GENERATOR

BACKGROUND OF THE INVENTION

1. FIELD OF THE INVENTION

The present invention relates to the problems of current gain fluctuations of bipolar transistors within integrated circuit semiconductor devices. More particularly, the present invention relates to a compensation current generator for generating a compensation current which is inversely proportional to the gain of a bipolar transistor, so as to compensate for current gain fluctuations of another bipolar transistor, which fluctuations can adversely affect the operation of the integrated circuit device which contains said bipolar transistors.

2. DESCRIPTION OF THE PRIOR ART

The current gain $\beta$, (termed "BETA") of a bipolar transistor can fluctuate, even when that transistor is driven by a constant current source. This current gain fluctuation is caused by process and/or temperature variations. Transistor deficiencies are typically circumvented in many transistor-circuit applications by maintaining the operating point of the transistors within some reasonable range, through the use of bias circuitry.

However, in some applications if nothing is done to provide more precise compensation for current gain fluctuations, the operation of a particular integrated circuit can be affected. In a semiconductor memory device, for example, current gain fluctuations can cause intolerable voltage fluctuations, with respect to a fixed reference voltage, resulting in reduced noise margin and, hence, faulty circuit operation. Thus, for these reasons, and others which will be explained more fully below, it is desirable to design a circuit in such a manner that compensation is provided, to a fixed reference voltage, for current gain fluctuations caused by temperature and/or process variations.

SUMMARY OF THE INVENTION

It is an object of the present invention to provide compensation for current gain fluctuations caused by temperature and/or process variations in a bipolar integrated circuit semiconductor device.

It is a further object of the present invention to improve the sense amplification function in semiconductor memory circuit applications.

An advantage of the present invention is a facilitation of the task of designing bipolar semiconductor circuits.

A further advantage of the present invention is an improvement in the reliability of bipolar integrated circuit semiconductor devices.

According to the present invention, a bipolar semiconductor device is configured to provide improved reliability and thus enhanced integrated circuit performance. Specifically, the present invention comprises a compensation current generator configured so as to provide compensation for fluctuations in the current gain of a bipolar transistor by providing a compensation current to the fixed reference voltage of an integrated circuit. The compensation current provided by the present invention is inversely proportional to transistor current gain. Thus, the provided compensation current causes the reference voltage to fluctuate as transistor current gain fluctuates, and therefore, the original noise margin of the circuit does not change.

DETAILED DESCRIPTION OF A SPECIFIC EMBODIMENT

Reference is now made in detail to a specific embodiment of the present invention, which illustrates the best mode presently contemplated by the inventor for practicing the invention, the specific embodiment of which is set forth in the accompanying drawings.

The compensation current generator circuit of the present invention has general application to circuits utilizing bipolar transistors. A bipolar semiconductor memory device is one such application. To provide a specific embodiment of the present invention, a compensation current generator utilized in a bipolar memory circuit is presented.

In a typical semiconductor memory device, a plurality of memory cells are arranged in an array forming columns of bits and rows of words where each cell is utilized for storing and retrieving binary information. A sense amplifier circuit is used to sense information stored in the individual cells of the memory array.

Figures 1, 2:
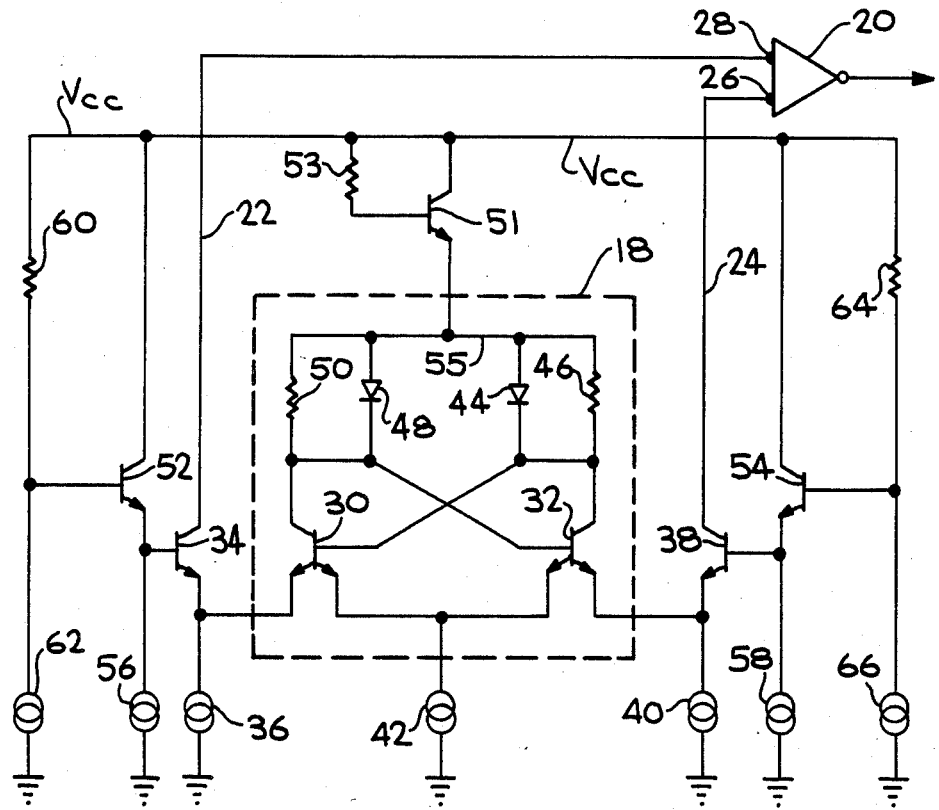
FIG. 1 is a schematic diagram of the relevant portion of a typical prior art memory cell/sensing circuit configuration.
FIG. 2 is a diagram showing the relationship between memory cell voltages and sense level voltage.

A conventional sense amplifier circuit, as illustrated in FIG. 1 of copending U.S. patent application Ser. No. 06-544323, filed Oct. 21, 1983, is comprised of a differential amplifier transistor pair with the base terminals of the two transistors functioning as dual input terminals to the sense amplifier. The sense amplifier detects, on its input terminals, a difference between two input (sense) currents received from a memory cell.

FIG. 1 shows a typical prior art memory cell 18 coupled to a sense amplifier 20. The sense currents on lines 22 and 24 are effectively converted to sense voltages at input terminals 26 and 28 of the sense amplifier 20. The sense amplifier 20 amplifies the difference between the input sense voltages and provides an output voltage proportional to the difference between the two voltages applied to the input terminals 26 and 28.

Referring to FIG. 1, the structure of the memory cell/sense amplifier circuit is as follows: memory cell 18 is comprised primarily of transistors 30 and 32 coupled together in a bistable circuit configuration such that when the transistor 30 is "on" (i.e., the base terminal voltage represents a logic-HIGH state), the transistor 32 is "off" (the base terminal voltage represents a logic-LOW state). Conversely, when the transistor 30 is "off", the transistor 32 is "on". The two states of operation (HIGH-LOW or LOW-HIGH) of the memory cell 18 correspond to a binary 0 or a binary 1 stored within the cell.

The emitter terminal of a transistor 34 and the first emitter terminal of the transistor 30 are connected together and this connection is coupled to a current source 36. In a similar manner, the emitter terminal of a transistor 38 and the first emitter terminal of the transistor 32 are connected together and this connection is coupled to a current source 40. Also in a similar fashion the second emitter terminals of the transistors 30 and 32 are connected together and this connection is coupled to a constant current source 42. The base terminal of the transistor 30 is coupled to the collector terminal of the transistor 32, to the cathode of a diode 44 and to one side of a resistor 46. Similarly, the base terminal of the transistor 32 is coupled to the collector terminal of the transistor 30, to the cathode of a diode 48 and to one side of a resistor 50. The anodes of diodes 44 and 48 are coupled together, on a word line 55, to the second side of resistors 46 and 50, and to the emitter terminal of a transistor 51. The word line 55 is coupled to a row select circuit (not shown). The row select circuit is coupled to an output terminal of an address decode circuit (also not shown). In this manner, the row including the memory cell 18 is selected by activating the row select circuit with the output from the address decode circuit.

The collector terminal of the transistor 51 is coupled to a voltage source line, $V_{cc}$. The base terminal of the transistor 51 is also coupled, through a load resistor 53, to the voltage source line, $V_{cc}$. As the current gain, Beta, of the transistor 51 fluctuates, the voltage across resistor 53 fluctuates, hence the base terminal voltages of the memory cell 18 fluctuate.

The collector terminals of a transistor 52 and a transistor 54 are coupled to the voltage source line, $V_{cc}$. The emitter terminal of the transistor 52 is coupled to a current source 56. Similarly, the emitter terminal of the transistor 54 is coupled to a current source 58. The base terminal of the transistor 52 is coupled through a resistor to the voltage source line $V_{cc}$ and is further coupled to a current source 62. Similarly, the base terminal of the transistor 54 is coupled through a resistor 64 to the voltage source line $V_{cc}$ and is further coupled to a current source 66.

The collector terminal of the transistor 34 is coupled to the sense amplifier 20 at the input terminal 28. Similarly, the collector terminal of the transistor 38 is coupled to the sense amplifier 20 at the input terminal 26.

An important design parameter in a memory cell-/sense amplifier design is the "sense level voltage." Referring again to FIG. 1, the sense level voltage is the voltage level located at the base terminals of the transistors 34 and 38, at which the sense amplifier 20 detects ("senses") the information stored within the memory cell 18.

FIG. 2 is a voltage plot showing the relationship between the sense level voltage and the voltage of the transistor base terminals of a typical memory cell. The sense level voltage is located somewhere between the "high base" and the "low base" voltage levels of the memory cell, where high base voltage is the base terminal voltage level of an "ON" transistor and low base is the base terminal voltage level of an "OFF" transistor within the memory cell.

The selection of the sense level voltalge is a function of circuit response time and noise margin. Referring again to FIG. 2, if the sense level were established closer to the low base voltage level, the circuit response time would decrease, but with a sacrifice of reduced noise margin. Conversely, if the sense level were set nearer the high base voltage level, the circuit response time would increase but with an improvement (increase) in noise margin.

Circuit response time and noise margin are also affected by $\beta$ fluctuation, which, as explained earlier is caused by temperature and/or process variation. The resulting voltage fluctuation corresponding to $\beta$ fluctuation during circuit operation makes it difficult to design a circuit based on a theoretically fixed sense level voltage that must be determined as a function of some fixed noise margin parameter. The result can be faulty circuit operation if this voltage fluctuation is not taken into consideration.

Figure 3:
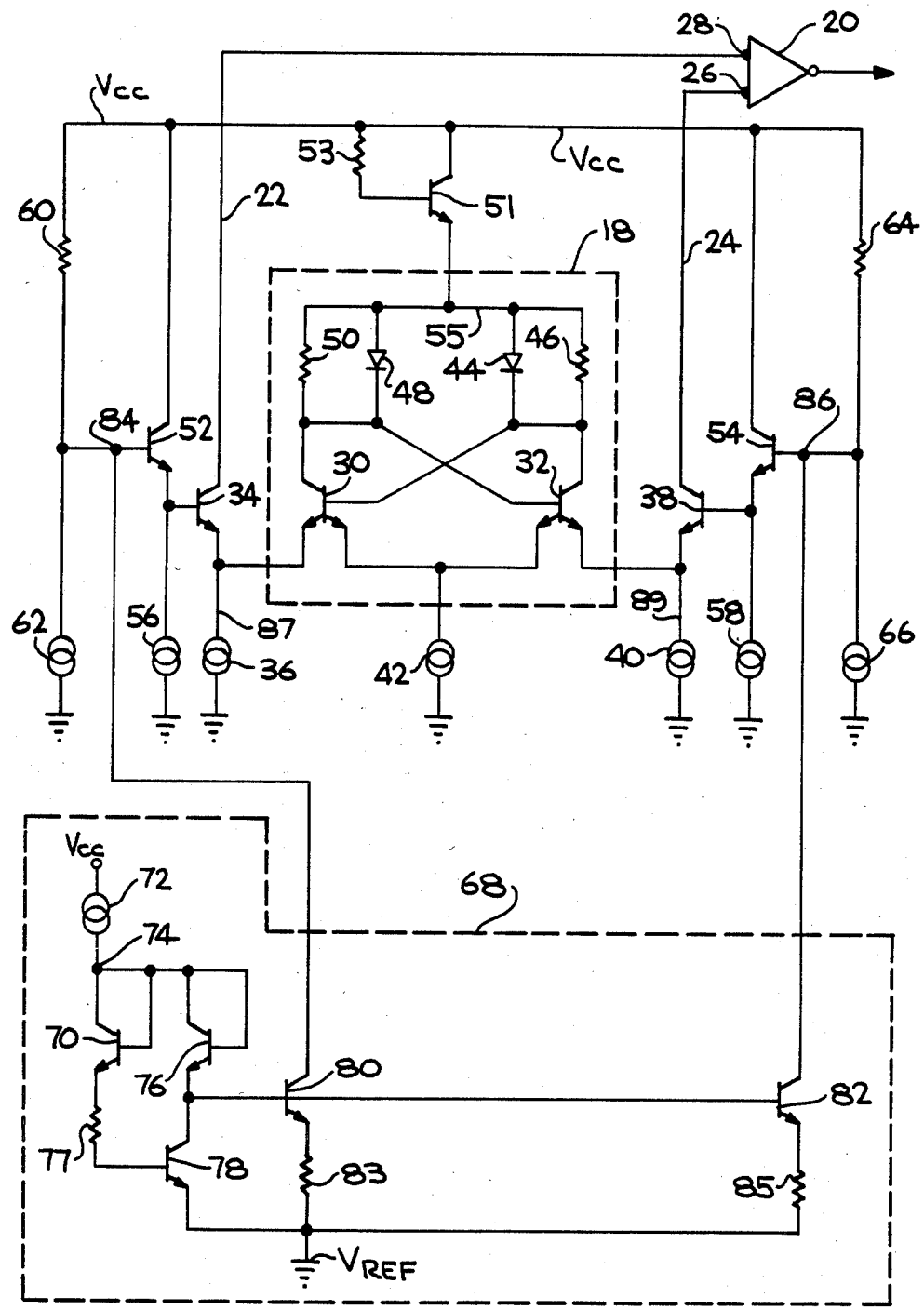
FIG. 3 is a schematic diagram of the compensation current generator circuit of the present invention, utilized in a semiconductor memory circuit application.

FIG. 3 shows a compensation current generator 68 according to the present invention. The compensation current generator 68 compensates for $\beta$ fluctuation in a semiconductor memory circuit application. The structure of the compensation current generator 68 will be discussed first followed by a discussion of its functional operation. The collector terminal and the base terminal of a transistor 70 are coupled together to a current source 72 at a circuit node 74 which is the input terminal of the compensation current generator 68. In a similar fashion, the collector terminal and the base terminal of a transistor 76 are connected together and this connection is also coupled to the current source 72 at the circuit node 74.

The emitter terminal of the transistor 70 is coupled through a resistor 77 to the base terminal of a transistor 78. The emitter terminal of the transistor 76 is connected to the collector terminal of the transistor 78 and to the base terminal of a transistor 80. The base terminal of a transistor 82 is also coupled to the base terminal of the transistor 80. The emitter terminal of the transistor 78 is coupled to a voltage reference terminal $V_{REF}$, at a ground potential. Transistors 80 and 82 are each coupled, through resistors 83 and 85, respectively, to the voltage reference terminal, $V_{REF}$.

The collector terminal of the transistor 80 is coupled to the base terminal of the transistor 52 at a circuit node 84 which is the first of two output terminals of the compensation current generator 68. Similarly, the collector terminal of the transistor 82 is coupled to the base terminal of the transistor 54 at a circuit node 86 which is the second output terminal of the compensation current generator 68.

The compensation current generator 68 operates to compensate for transistor current gain fluctuations by providing a current at the circuit nodes 84 and 86 to the base terminals of the transistors 52 and 54, respectively, which current is shown below to be inversely proportional to the current gain of the transistor 78. Transistor 78 is designed to be exactly the same as transistor 51, such that the $\beta$ fluctuations of transistor 78 mirror the $\beta$ fluctuations of the transistor 51, which, as explained below, compensates for base terminal voltage fluctuations in the memory cell 18. The operation of the compensation current generator 68 can be seen from the following derivation which refers again to FIG. 3 and, specifically, to the circuit configuration of the compensation current generator 68:

The voltage at the circuit node 74 (the input terminal of the compensation current generator 68) can be described as:

$$V_x = V_{BE70} + V_{BE78} + V_{R77} + V_{BE76} + V_{BE80} + V_{R83} \quad (1)$$

where:

$V_x$ = voltage at the circuit node 74;
$V_{BE70}$ = Base-emitter voltage of the transistor 70;
$V_{BE78}$ = Base-emitter voltage of the transistor 78;
$V_{BE76}$ = Base-emitter voltage of the transistor 76;
$V_{BE80}$ = Base-emitter voltage of the transistor 80;
$V_{R77}$ = Voltage across the resistor 77; and
$V_{R83}$ = Voltage across the resistor 83.

Since the emitter of the transitor 76 is tied to the collector of the transistor 78, then:

$$I_{76} \simeq I_{78}, \quad (2)$$

where:
$I_{76}$ = emitter current through transistor 76; and
$I_{78}$ = emitter current through transistor 78.
Solving for $V_{BE80} + V_{R83}$:

$$V_{BE80} + V_{R83} = V_{BE70} - V_{BE76} + V_{BE78} + V_{R77} \quad (3)$$

If identical transistors are chosen for the transistors 76 and 78, and since $I_{76} \simeq I_{78}$, then:

$$V_{BE76} \simeq V_{BE78},$$

and equation (3), above, becomes:

$$V_{BE80} + V_{R83} \simeq V_{BE70} + V_{R77} \quad (4)$$

If identical transistors are chosen for the transistors 70 and 80, and $R_{83} = R_{77}$ then:

$$I_{80} \simeq I_{70} \quad (5)$$

where:
$I_{80}$ = emitter current of the transistor 80; and
$I_{70}$ = emitter current of the transistor 70.
Also:

$$I_{70} = (I_{72}/\beta + 1) \quad (6)$$

where:
$I_{72}$ = current generated by the constant current source 72; and
$\beta$ = Beta (current gain)
Finally, referring back to equation (6), since $I_{80} \simeq I_{70}$, and $I_{70} = (I_{72}/\beta + 1)$, then $$I_{80} \simeq (I_{72}/\beta + 1) \quad (7)$$

Thus, the current through the transistor 80 will vary with inverse proportionality to any variance in $\beta$. Hence, a current $I_{72}$, from the current source 72 is used to generate a second current, $I_{72}/\beta + 1$, which is inversely proportional to $\beta$, and this current is supplied, at the circuit node 84, to the base terminal of the transistor 52, which is coupled to a first bit line 87 of the memory cell 18. An identical current $I_{72}/\beta + 1$ is provided by the transistor 82 to the base terminal of the transistor 54, at the circuit node 86. The transistor 54 is coupled to a second bit line 89. Thus, any fluctuation in $\beta$ is compensated for by a current equal to $I_{72}/\beta + 1$ delivered in the base terminals of the transistors 52 and 54. As a result, the sense level voltages delivered to the terminals 84 and 86 will fluctuate as $\beta$ fluctuates. Thus, the sense level voltage will shift the track any fluctuation in $\beta$, in the same manner as the memory cell base terminals, thereby preventing any erosion in noise margin.

To summarize, then, if $I_x/\beta + 1$ is the design output current desired, and $I_x$ is some reference current, designing $I_{72} = I_x$, and substituting $I_x$ into equation (7):

$$I_{80} = (I_x/\beta + 1) \quad (8)$$

An additional advantage of the compensation current generator 68 is that the desired compensation for $\beta$ fluctuation is achieved without requiring large amounts of additional power. Furthermore, the compensation current generator 68 can be configured so as to provide a compensation current at multiple circuit nodes, such as the transistors 80 and 82, still without requiring additional power. Another feature of the present invention is that $I_{72}$ is scaled down. This can be explained as follows:

Referring again to FIG. 3, assuming that the transistor 80 is n times larger than the transistor 70 in emitter area and, assuming also that:

$$R_{83} = (R_{77}/n), \quad (9)$$

where:
$R_{83}$ = resistance value of the resistor 83,
$R_{77}$ = resistance value of the resistor 77, and
n = emitter area ratio of the transistor 80 to the transistor 70,
Then, equation (5), above, becomes:

$$I_{80} \simeq n\, I_{70}; \quad (10)$$

Referring back to equation (8), above, since $$I_{80} = (I_x/\beta + 1), \text{ and } I_{80} \simeq n\, I_{70}, \text{ then:}$$

$$I_{70} = (1/n)(I_x/\beta + 1), \quad (11)$$

and therefore, the desired compensation current of $I_{80} = I_x/\beta + 1$ can be achieved by scaling down the current $I_x$ by a factor of n (the emitter area ratio of the transistor 80 to the transistor 70). Thus, the current required at circuit node 74 to provide the desired compensation is:

$$, I_{72} = I_x/n \quad (12)$$

A specific embodiment of the present invention has been described for a semiconductor memory application. The present invention can be useful in many applications where compensation for $\beta$ fluctuation is needed. Other applications will be apparent to those of ordinary skill in the art. In FIG. 3, for example, the transistors 70 and 76 could be combined into one double-emitter transistor, as is commonly done today in the manufacture of semiconductor integrated circuits.

The foregoing description of a specific embodiment of the present invention has been presented for purposes of illustration and description. It is not intended to be exhaustive or to limit the invention to the precise form disclosed, and obviously many modifications and variations are possible in the light of the above teaching. The embodiment was chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. A circuit including a reference current source and at least one transistor contained therein, said circuit providing a current at an output terminal, which current is inversely proportional to the current gain of said at least one transistor, and is directly proportional to said reference current source, and is directly proportional to a scaling factor n, said circuit further including, a diode-connected compensation transistor having a collector terminal, a base terminal, and first and second emitter terminals, said collector terminal being coupled to said reference current source, said base terminal being coupled to said collector terminal of said diode-connected compensation transistor, said first emitter terminal being coupled through a first resistance element to a base terminal of said at least one transistor, and said second emitter terminal being coupled to a collector terminal of said at least one transistor, and a second compensation transistor having a base terminal coupled to the second emitter terminal of said diode-connected compensation transistor, said base terminal of said second compensation transistor being further coupled to the collector terminal of said at least one transistor, said second compensation transistor also having an emitter terminal coupled through a second resistance element to a reference voltage terminal, and a collector terminal coupled to said output terminal of said circuit, said at least one transistor having an emitter terminal coupled to said reference voltage terminal.

2. A circuit including a reference current source and at least one transistor contained therein, said circuit providing a current at an output terminal, which current is inversely proportional to the current gain of said at least one transistor, and is directly proportional to a scaling factor n, said circuit further including:

a first diode-connected compensation transistor having an emitter terminal, a collector terminal and a base terminal, said collector terminal being coupled to said reference current source, said base terminal being coupled to said collector terminal of said first diode-connected compensation transistor, and said emitter terminal being coupled through a first resistance element to a base terminal of said at least one transistor, a second diode-connected compensation transistor having an emitter terminal, a collector terminal and a base terminal, said collector terminal and said base terminal of said second diode-connected compensation transistor being coupled together to the base terminal and the collector terminal of said first diode-connected compensation transistor, and said emitter terminal being coupled to a collector terminal of said at least one transistor, and a third compensation transistor having a base terminal coupled to the emitter terminal of said second diode-connected compensation transistor, said base terminal of said third compensation transistor being further coupled to the collector terminal of said at least one transistor, said third compensation transistor also having an emitter terminal coupled through a second resistance element to a reference voltage terminal, and a collector terminal coupled to said output terminal of said circuit, said at least one transistor having an emitter terminal coupled to said reference voltage terminal.

3. In a semiconductor integrated circuit device including first and second bipolar transistors, a compensation current generator circuit having an output terminal coupled to a base terminal of said second bipolar transistor for providing a compensation current to said base terminal of said second bipolar transistor, which compensation current is inversely proportional to the current gain of said first bipolar transistor, and is directly proportional to a reference current source, and is directly proportional to a scalin factor n, said compensation current generator circuit further including a diode-connected compensation transistor having a collector terminal, a base terminal, and first and second emitter terminals, said collector terminal being coupled to said reference current source, said base terminal being coupled to said collector terminal of said diode-connected compensation transistor, said first emitter terminal being coupled through a first resistance element to a base terminal of said first bipolar transistor, and said second emitter terminal being coupled to a collector terminal of said first bipolar transistor, and a second compensation transistor having a base terminal coupled to the second emitter terminal of said diode-connected compensation transistor, said base terminal of said second compensation transistor being further coupled to the collector terminal of said first bipolar transistor, said second compensation transistor also having an emitter terminal coupled through a second resistance element to a reference voltage terminal, and a collector terminal coupled at said output terminal of said compensation current generator circuit to the base terminal of said second bipolar transistor, said first bipolar transistor also having an emitter terminal coupled to said reference voltage terminal.

4. In a semiconductor integrated circuit device including first and second bipolar transistors, a compensation current generator circuit having an output terminal coupled to a base terminal of said second bipolar transistor for providing a compensation current to said base terminal of said second bipolar transistor, which compensation current is inversely proportional to the current gain of said first bipolar transistor, and is directly proportional to a reference current source, and is directly proportional to a scaling factor n, said integrated circuit further including:

a first diode-connected compensation transistor having an emitter terminal, a collector terminal and a base terminal, said collector terminal being coupled to said reference current source, said base terminal being coupled to said collector terminal of said first diode-connected compensation transistor, and said emitter terminal being coupled through a first resistance element to a base terminal of said first bipolar transistor, a second diode-connected compensation transistor having an emitter terminal, a collector terminal and a base terminal, said collector terminal and said base terminal of said second diode-connected compensation transistor being coupled together to the base terminal and the collector terminal of said first diode-connected compensation transistor, and said emitter terminal being coupled to a collector terminal of said first bipolar transistor, and a third compensation transistor having a base terminal coupled to the emitter terminal of said second diode-connected compensation transistor, said base terminal of said third compensation transistor being further coupled to the collector terminal of said first bipolar transistor, said third compensation transistor also having an emitter terminal coupled through a second resistance element to a reference voltage terminal, and a collector terminal coupled at said output terminal of said compensation current generator circuit to the base terminal of said second bipolar transistor, said first bipolar transistor also having an emitter terminal coupled to said reference voltage terminal.

5. In a bipolar semiconductor memory device including at least first and second bipolar transistors, a compensation current generator circuit which compensates for transistor current gain fluctuations occurring in said second bipolar transistor by generating a compensation current which is inversely proportional to the current gain of said first bipolar transistor and is directly proportional to a reference current source, and is directly proportional to a scaling factor n, said compensation current generator circuit having at least one output terminal coupled to a base terminal of said second bipolar transistor, said compensation current generator circuit further including a diode-connected compensation transistor having a collector terminal, a base terminal, and first and second emitter terminals, said collector terminal being coupled to a reference current source, said base terminal being coupled to said collector terminal of said diode-connected compensation transistor, said first emitter terminal being coupled through a first resistance element to a base terminal of said first bipolar transistor, and said second emitter terminal being coupled to a collector terminal of said first bipolar transistor, and a second compensation transistor having a base terminal coupled to the second emitter terminal of said diode-connected compensation transistor, said base terminal of said second compensation transistor being further coupled to the collector terminal of said first bipolar transistor, said second compensation transistor also having an emitter terminal coupled through a second resistance element to a reference voltage terminal, and a collector terminal coupled at said output terminal of said compensation current generator circuit to the base terminal of said second bipolar transistor, said first bipolar transistor also having an emitter terminal coupled to said reference voltage terminal.

6. In a bipolar semiconductor memory device including at least first and second bipolar transistors, a compensation current generator circuit which compensates for transistor by generating a compensation current which is inversely proportional to the current gain of said first bipolar transistor and is directly proportional to a reference current source, and is directly proportional to a scaling factor n, said compensation current generator circuit having at least one output terminal coupled to a base terminal and said second bipolar transistor, said compensation current generator circuit further including a first diode-connected compensation transistor having an emitter terminal, a collector terminal and a base terminal, said collector terminal being coupled to said reference current source, said base terminal being coupled to said collector terminal of said first diode-connected compensation transistor, said emitter terminal being coupled through a first resistance element to a base terminal of said first bipolar transistor;

a second diode-connected compensation transistor having an emitter terminal, a collector terminal and a base terminal, said collector terminal and said base terminal of said second diode-connected compensation transistor being coupled together to the base terminal and to collector terminal of said first diode-connected compensation transistor, and said emitter terminal being coupled to a collector terminal of said first bipolar transistor; and a third compensation transistor having a base terminal coupled to the emitter terminal of said second diode-connected compensation transistor, said base terminal of said third compensation transistor being further coupled to the collector terminal of said first bipolar transistor, said third compensation transistor also having an emitter terminal coupled through a second resistance element to a reference voltage terminal, and a collector terminal coupled at said output terminal of said compensation current generator circuit to the base terminal of said second bipolar transistor, said first bipolar transistor also having an emitter terminal coupled to said reference voltage terminal.

7. The circuit of claim 6, further including at least a fourth compensation transistor having a base terminal coupled to the base terminal of said third compensation transistor, an emitter terminal coupled through a third resistance element to said reference voltage terminal, and a collector terminal coupled, at a second output terminal of said compensation current generator circuit, to a base terminal of a third bipolar transistor, wherein said second and third bipolar transistors are coupled to first and second bit lines, respectively, of an individual memory cell of said bipolar semiconductor memory device.

8. A method for compensating for current gain fluctuations in a first transistor of a semiconductor memory integrated circuit, said memory circuit having a memory cell coupled to a sense amplifier through second and third transistors, said memory cell being further coupled to a voltage supply terminal through said first transistor, said method comprising the steps of:

coupling a compensation transistor of a compensation current generator circuit to said voltage supply terminal, said compensation transistor being identical in design to said first transistor of said memory circuit, such that current gain fluctuations of said compensation transistor are the same as the current gain fluctuations of said first transistor;

coupling a collector terminal of said compensation transistor through a first output transistor of the compensation current generator circuit to a base terminal of said second transistor of the memory circuit; and coupling the collector terminal of said compensation transistor through a second output transistor of the compensation current generator circuit to a base terminal of said third transistor of the memory circuit, such that current gain fluctuations of said compensation transistor, which are the same as current gain fluctuations of said first transistor, are transmitted to the base terminals of said second and third transistor, respectively, thereby compensating for the current gain fluctuations transmitted by said first transistor to said memory cell.

* * * * *